United States Patent
Huang et al.

(10) Patent No.: US 10,593,513 B2
(45) Date of Patent: Mar. 17, 2020

(54) MEMBRANE ASSEMBLY, EXAMINATION CONTAINER AND ELECTRON MICROSCOPE

(71) Applicant: Taiwan Electron Microscope Instrument Corporation, Hsinchu (TW)

(72) Inventors: Tsu-Wei Huang, Hsinchu (TW); Jia-Ling Wu, New Taipei (TW); Shih-Yi Liu, Kaohsiung (TW); Maochan Chang, Zhubei (TW)

(73) Assignee: TAIWAN ELECTRON MICROSCOPE INSTRUMENT CORPORATION, Hsinchu (TW)

( * ) Notice: Subject to any disclaimer, the term of this patent is extended or adjusted under 35 U.S.C. 154(b) by 0 days.

(21) Appl. No.: 16/038,461

(22) Filed: Jul. 18, 2018

(65) Prior Publication Data

US 2020/0027695 A1    Jan. 23, 2020

(51) Int. Cl.
*H01J 37/26* (2006.01)
*H01J 37/00* (2006.01)
*H01J 37/16* (2006.01)
*H01J 37/244* (2006.01)

(52) U.S. Cl.
CPC ............ *H01J 37/265* (2013.01); *H01J 37/16* (2013.01); *H01J 37/244* (2013.01); *H01J 2237/2608* (2013.01)

(58) Field of Classification Search
CPC ........ H01J 37/265; H01J 37/16; H01J 37/244; H01J 2237/2608
USPC ........... 250/306, 307, 309, 310, 311, 440.11, 250/441.11, 442.11, 443.1
See application file for complete search history.

(56) References Cited

U.S. PATENT DOCUMENTS

2006/0171850 A1* 8/2006 Waterbury .......... B01L 3/50255
                                                        422/63
2012/0298883 A1* 11/2012 Grogan .................. H01J 37/20
                                                      250/440.11
2013/0313430 A1    11/2013 Ominami et al.

FOREIGN PATENT DOCUMENTS

| CN | 101013649 A | 8/2007 |
| CN | 104520967 A | 4/2015 |
| TW | 200639901 A | 11/2006 |
| TW | 200723344 A | 6/2007 |

(Continued)

*Primary Examiner* — Nicole M Ippolito
(74) *Attorney, Agent, or Firm* — Muncy, Geissler, Olds & Lowe, PC

(57) ABSTRACT

An examination container includes a main body, a membrane assembly and a cover. The main body has an accommodating trough for holding sample. The membrane assembly covers an opening end of the accommodating trough. The membrane assembly includes a support body and a membrane. The support body has a first surface and a second surface, wherein the support body is flat and has a first through-hole penetrating through the first surface and the second surface. The membrane is arranged on the second surface side of the support body and has a second through-hole. The second through-hole is opposite to the first through-hole and allows a charged particle beam to pass the second through-hole. The cover is detachably connected to the main body to secure the membrane assembly. The membrane assembly is easy to replace and uses less consumables. An electron microscope using the abovementioned examination container is also disclosed.

22 Claims, 6 Drawing Sheets

(56) References Cited

FOREIGN PATENT DOCUMENTS

TW   201303951 A   1/2013
WO   WO2014069470 A   5/2014

* cited by examiner

MEMBRANE ASSEMBLY, EXAMINATION CONTAINER AND ELECTRON MICROSCOPE

BACKGROUND OF THE INVENTION

1. Field of the Invention

The present invention relates to an examination technology using an electron microscope, particularly to a membrane assembly, an examination container and an electron microscope, which facilitate examining samples under an ambient pressure.

2. Description of the Prior Art

The conventional electron microscope is unlikely to examine samples under an ambient pressure (such as a liquid sample or a solid-state sample) but can only examine samples in a vacuum environment. So far, an electron microscope technology has been developed to overcome the abovementioned problem, wherein a membrane separates a non-vacuum environment from a vacuum environment, and a charged particle beam penetrates the membrane. In other words, the space between the membrane and an electron gun is in a vacuum environment, and the space between the membrane and a sample is in a non-vacuum environment. Thereby, the electron microscope can examine a sample existing at ambient pressure, such as suspended particles, reacting gas, or a living biological sample.

Nevertheless, the membrane will be inevitably damaged or contaminated under the bombarding of charged particles. In the conventional technology, the membrane is attached to block material, and the block material is fastened to a given position with screws. Therefore, the process of replacing the membrane is more laborious and likely to consume more material.

Accordingly, the technology to replace membranes easily and fast becomes the target the manufacturers are eager to achieve.

SUMMARY OF THE INVENTION

The present invention provides a membrane assembly, wherein a membrane is disposed on a flat support body, and wherein the membrane assembly is secured to a main body by a cover to form an examination container used in an electron microscope examination, whereby the operator can easily replace the membrane assembly and the material consumption is significantly reduced in replacing membranes.

In one embodiment, the membrane assembly of the present invention includes a support body and a membrane. The support body has a first surface and a second surface opposite to the first surface. The support body is a flat structure and has a first through-hole penetrating the first surface and the second surface. The membrane is disposed on the second surface of the support body and has a second through-hole. The second through-hole is corresponding to the first through-hole and allows a charged particle beam to pass.

In one embodiment, the container of the present invention includes a main body, a membrane assembly and a cover. The main body has an accommodating trough for holding a sample. The membrane assembly covers an opening of the accommodating trough. The membrane assembly includes a support body and a membrane. The support body has a first surface and a second surface opposite to the first surface. The support body is a flat structure and has a first through-hole penetrating the first surface and the second surface. The membrane is disposed on the second surface of the support body and has a second through-hole. The second through-hole is corresponding to the first through-hole and allows a charged particle beam to pass. The cover is detachably connected to the main body to secure the membrane assembly.

In one embodiment, the electron microscope of the present invention includes an examination chamber, a charged particle beam generator, an examination container, and a detector. The examination chamber defines a vacuum environment. The charged particle beam generator interconnects with examination chamber, generating a charged particle beam inside the examination chamber. The examination container is placed inside the examination chamber and bombarded by the charged particle beam. The container includes a main body, a membrane assembly and a cover. The main body has an accommodating trough for holding a sample. The membrane assembly covers an opening of the accommodating trough. The membrane assembly includes a support body and a membrane. The support body has a first surface and a second surface opposite to the first surface. The support body is a flat structure and has a first through-hole penetrating the first surface and the second surface. The membrane is disposed on the second surface of the support body and has a second through-hole. The second through-hole is corresponding to the first through-hole and allows a charged particle beam to pass and bombard the sample. The cover is detachably connected to the main body to secure the membrane assembly. The detector detects the response to the bombarding of the charged particle beam on the sample and converts the response into electronic signals.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1:
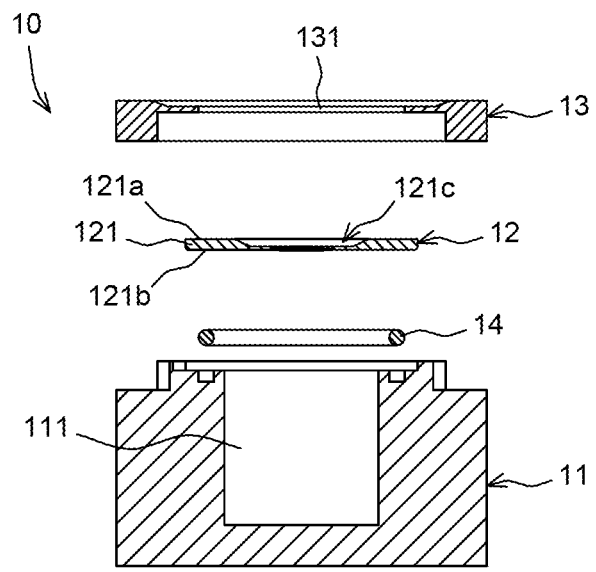
FIG. 1 is an exploded view schematically showing an examination container according to a first embodiment of the present invention.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 2:
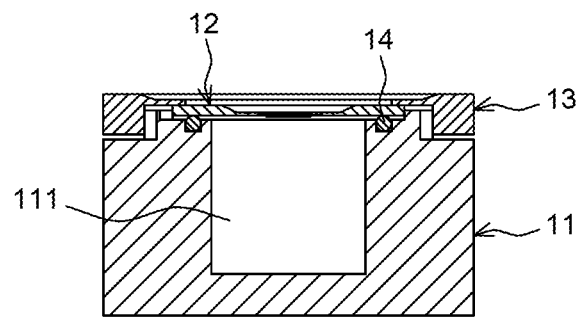
FIG. 2 is an assembly drawing schematically showing an examination container according to the first embodiment of the present invention.
Figure 3:
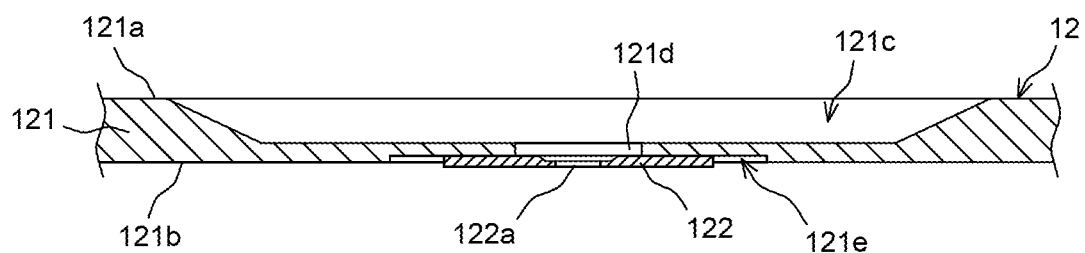
FIG. 3 is a locally-enlarged view schematically showing a membrane assembly according to the first embodiment of the present invention.

Refer to the first embodiment in FIGS. 1-3, the examination container 10 of the present invention is placed inside an examination chamber of an electron microscope, whereby a sample inside the examination container 10 can be examined. The container 10 includes a main body 11, a membrane assembly 12 and a cover 13. The main body 10 has an accommodating trough 111 for holding a sample, such as suspended particles or a living biological sample. In one embodiment, the main body 11 is made of a stainless steel. The membrane assembly 12 covers an opening of the accommodating trough 111 to seal the accommodating trough 111.

Figure 11:
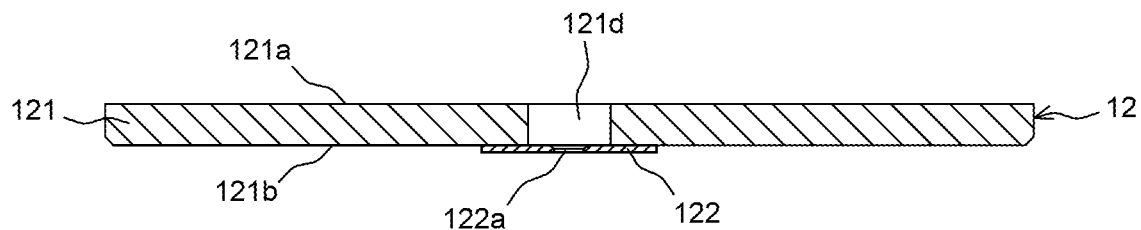
FIG. 11 is a diagram schematically showing a membrane assembly according to another embodiment of the present invention.

In the first embodiment shown in FIG. 3, the membrane assembly 12 includes a support body 121 and a membrane 122. The support body 121 has a first surface 121a and a second surface 121b opposite to the first surface 121a. The support body 121 is a flat structure and has a first through-hole 121d. The support body 121 has a thinned region, and the first through-hole 121d is within the coverage of the thinned region. The thinned region is to reduce the height of the sidewall of the first through-hole 121d. In the first embodiment, a first trough 121c is formed on the first surface 121a of the support body 121, and the first through-hole 121d is formed on the bottom of the first trough 121c, whereby the height of the sidewall of the first through-hole 121d is reduced. Refer to FIG. 11. In one embodiment, no thinned region is formed on the support body 121. In other words, there is no variation in the height drop between the first surface 121a and the second surface 121b. It is easily understood: the sidewall of the first through-hole 121d may impair the reception of signals in such a case. In one embodiment, the ratio of the height of the sidewall of the first through-hole 211d to the width of the first through-hole 121d is less than or equal to 0.7. In one embodiment, the support body 121 is made of metallic material, metallic compound material, non-metallic compound material, or polymer material. The metallic material or the metallic compound material be aluminum, copper, stainless steel or aluminum oxide. The non-metallic compound material may be glass, ceramic, nitride, carbide, or silicide. The polymer material may be plastic or rubber.

The membrane 122 is disposed on the second surface 121b of the support body 121 and has a second through-hole 122a. The second through-hole 122a of the membrane 122 is corresponding to the first through-hole 121d of the support body 121. Hence, a charged particle beam can pass through the first through-hole 121d and the second through-hole 122a to enter the accommodating trough 111 and bombard the sample. It is noted that the membrane 122 may further include a film covering the second through-hole 122a so that the air impermeability of the accommodating trough 111 can be maintained. To simplify the drawings, the film covering on the second through-hole 122a is omitted in the figure. In one embodiment, the membrane 122 is a thin film chip. The material of the thin film chip may be semiconductor nitride, semiconductor oxide, metal oxide, polymer, graphite, graphene, or another appropriate material.

The cover 13 is detachably connected to the main body 11 to secure the membrane assembly 12. In one embodiment, the cover 13 can be rotated with respect to the main body 11 and locked to the main body 11 to stress the membrane assembly 12 tightly and preventing the sample from leaking out. In one embodiment, corresponding threads are respectively formed on the cover 13 and the main body 11, whereby the cover 13 can be rotated with respect to the main body 11 and engaged with the main body 11. In one embodiment, an O-ring 14 is disposed between the main body 11 and the support body 121 to enhance the airtight effect. Understandably, the cover 13 has an appropriate opening 131 to avoid the first through-hole 121d of the support body 121 and the second through-hole 122a of the membrane 122 being blocked. In one embodiment, the cover 13 is made of a stainless steel.

Thereby, the operator can rotate the cover 13 to directly release the cover 13. After the cover 13 is released, the operator may replace the membrane 122 instantly. Therefore, the operator can easily and fast replace the damaged membrane assembly 12. The support body 121 is a flat structure. Thus, the membrane 122 can be taken off from the support body 121 easily. Then, a new membrane 122 is attached to the original support body 121. Therefore, the support body 121 can be recycled. Hence, the present invention can reduce consumption of material.

In one embodiment, the second through-hole 122a is a circular hole, a rectangular hole, or a slot-like hole. It is easily understood: while the second through-hole 122a is a circular hole, the membrane 122 can tolerate greater stress. In other words, while the pressure is identical, the membrane 122 may have a circular through-hole 122a with the dimensions larger than the dimensions of a rectangular through-hole 122a without breakage of a film covering the through-hole 122a. A larger circular through-hole can acquire a larger detection area. In one embodiment, the sidewall of the second through-hole 122a has stepped heights. As shown in FIG. 3, the second through-hole 122a is larger on the side facing the support body 12 lest the backward scattered charged particles and X-ray photons generated by the sample be blocked by the membrane 122.

Figure 12:
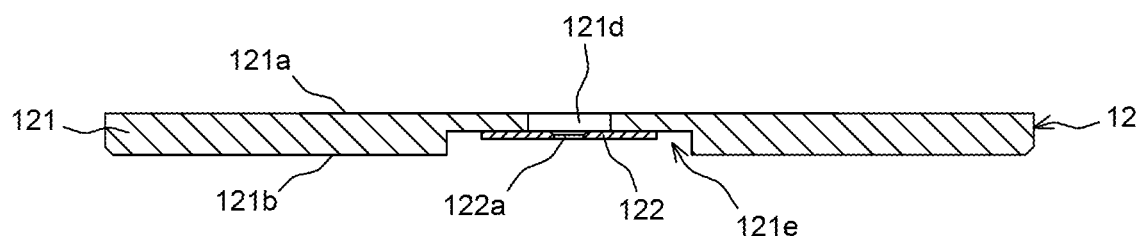
FIG. 12 is a diagram schematically showing a membrane assembly according to yet another embodiment of the present invention.

In one embodiment, the second surface 121b of the support body 121 has a second trough 121e, and the membrane 122 is disposed inside the second trough 121e. It should be noted that the depth of the second trough 121e is less than the thickness of the membrane 122. Thus, the membrane 122 slightly protrudes from the second surface 121b of the support body 121 lest air pockets stay in the second through-hole 122a and repel the sample or affect examination. It is easily understood: in the case where no air pocket exists, such as a case of observing a gas sample, the depth of the second trough 121e is allowed to be greater than the thickness of the membrane 122, as shown in FIG. 12. In one embodiment, the shape of the second trough 121e is a circle, a rectangle, or a rectangle with rounded corners.

Figure 4:
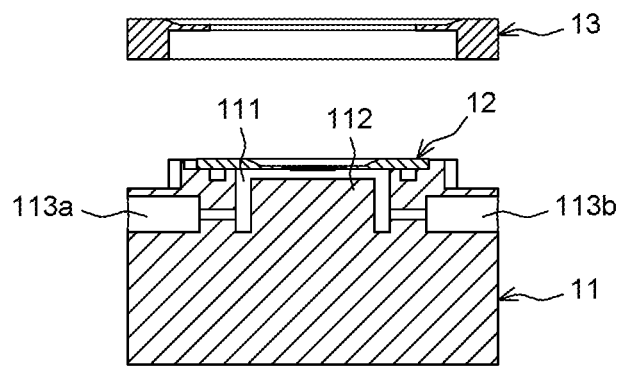
FIG. 4 is a diagram schematically showing an examination container according to a second embodiment of the present invention.

Refer to FIG. 4, wherein the O-ring 14 is omitted to simplify the drawing. In one embodiment, a carrier stage 112 is disposed in the accommodating trough 111 and corresponding to the second through-hole 122a of the membrane 122. The charged particle beam is likely to be absorbed by liquid so as to only penetrate to a shallow depth in such a case. Via designing a carrier stage 112 with an appropriate height, the distance between the carrier stage 112 and the membrane assembly 12 can be adjusted to an appropriate value to guarantee that the sample on the carrier stage 112 can be bombarded by the charged particle beam and that the backward scattered charged particles and X-ray photons can penetrate the membrane 112 and can be detected by the detector. In one embodiment, a fluid inlet 113a and a fluid outlet 113b are formed in the accommodating trough 111. A fluid sample flows into the accommodating trough 111 via the fluid inlet 113a, passes through the carrier stage 112 for examination, and then flows out of the accommodating trough 111 via the fluid outlet 113b. It is preferred: the distance between the membrane assembly 12 and either of the fluid inlet 113a and the fluid outlet 113b is larger than the distance between the membrane assembly 12 and the carrier stage 112 to prevent from that air pockets are generated on the top of the accommodating trough 111.

Figure 5:
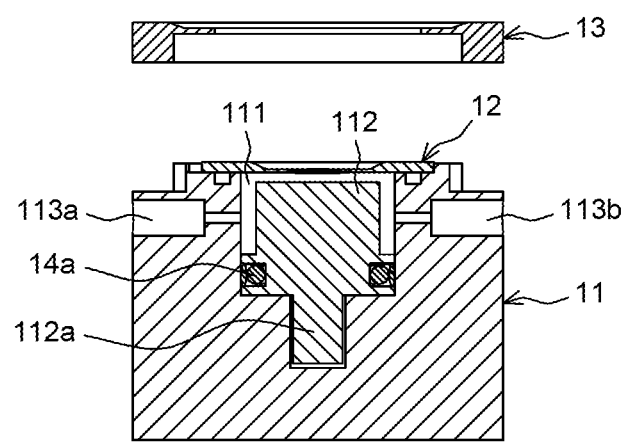
FIG. 5 is a diagram schematically showing an examination container according to a third embodiment of the present invention.

Refer to FIG. 5, the carrier stage 112 is detachably installed inside the accommodating trough 111. In one embodiment, a positioning pin 112a is formed on the bottom of the carrier stage 112. In installing the carrier stage 112, the positioning pin 112a is aligned to a hole in the accommodating trough 111, and the carrier stage 112 is pushed into the accommodating trough 111, whereby is completed the installation of the carrier stage 112. In this embodiment, the operator can use the carrier stages 112 with different heights to adjust the distance between the carrier stage 112 and the membrane assembly 12. In one embodiment, an O-ring 14a is disposed around the carrier stage 112 to prevent the sample or liquid from entering the bottom of the accommodating trough 111.

Figure 6:
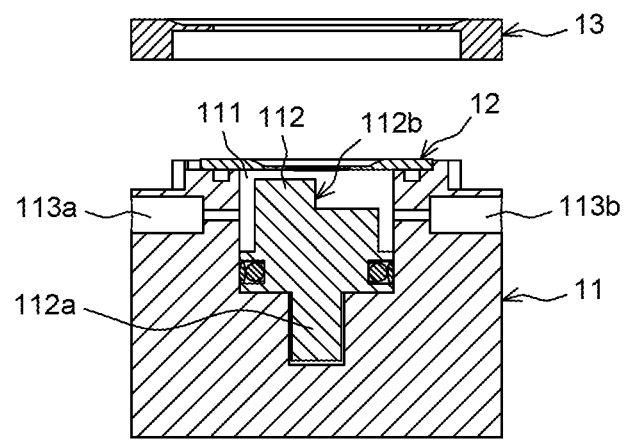
FIG. 6 is a diagram schematically showing an examination container according to a fourth embodiment of the present invention.

Refer to FIG. 6, the carrier stage 112 has a standing surface 112b. For example, different areas of the top surface of the carrier stage 112 are fabricated to respectively have different heights, whereby the standing surface 112b is formed. In this embodiment, the sample can prop against the standing surface 112b, whereby the lateral surface of the sample, such as the depth by which an etchant etches a sample, can be examined. It is noted that the standing surface 112b is not necessarily a vertical surface. The standing surface 112 may be an inclined surface, whereby the sample can be observed from different angles.

Figure 7:
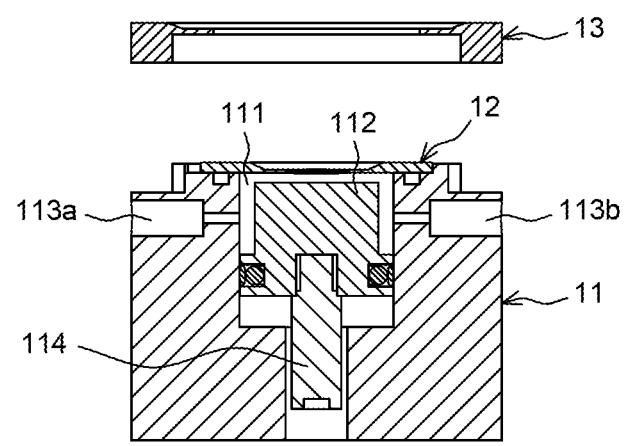
FIG. 7 is a diagram schematically showing an examination container according to a fifth embodiment of the present invention.

Refer to FIG. 7, a pushing rod 114 is disposed in the bottom of the carrier stage 112 and extended out of the accommodating trough 111, whereby the operator can use the pushing rod 114 to adjust the altitude of the carrier stage 112, i.e. adjust the distance between the carrier stage 112 and the membrane assembly 12, without opening the examination container. In one embodiment, the pushing rod 114 has a thread, and the operator can use an appropriate tool to rotate the pushing rod 114 to adjust the distance between the carrier stage 112 and the membrane assembly 12. In one embodiment, the pushing rod 114 is driven by electricity.

Figure 8:
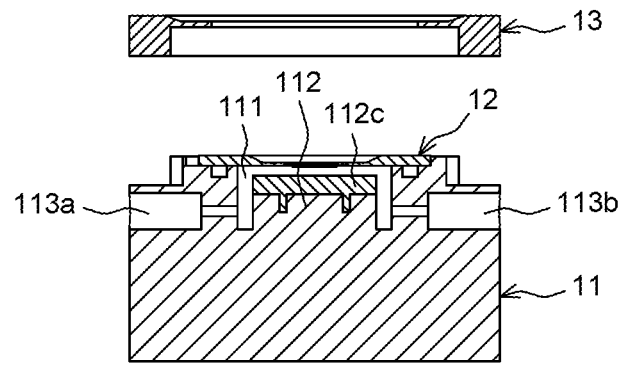
FIG. 8 is a diagram schematically showing an examination container according to a sixth embodiment of the present invention.

Refer to FIG. 8, the examination container includes a sample pad 112c. The sample pad 112c is detachably disposed on the op surface of the carrier stage 112. The sample pad 112c may be a disposable element used in the examination of a high-pollution or sample or a hard-to-clean sample. Alternatively, a living biological sample can be cultured on the sample pad 112c, and then the sample pad 112c having the living biological sample is placed on the carrier stage 112 for examination. In one embodiment, an appropriate pattern is formed on the sample pad 112c to control the flowing behavior of a fluid sample and favor the examination of the fluid sample.

Figure 9:
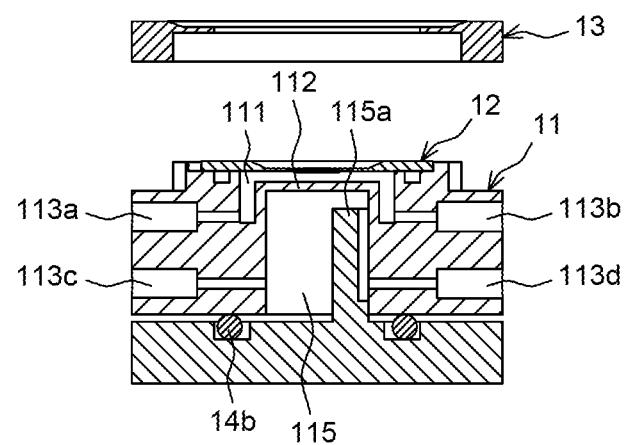
FIG. 9 is a diagram schematically showing an examination container according to a seventh embodiment of the present invention.

Refer to FIG. 9, the carrier stage 112 has a temperature-control channel 115 formed in the lower part of the carrier stage 112. A temperature-control fluid flows into the temperature-control channel 115 via a temperature fluid inlet 113c to heat or cool down the sample on the carrier stage 112 and then flows out via a temperature fluid outlet 113d. After being heated or cooled down, the temperature-control fluid may flow into the temperature-control channel to form a cycling temperature-control system. In one embodiment, a protrusion 115a is disposed inside the temperature-control channel 115, whereby the temperature-control channel 115 near the sample is fully filled with the temperature-control fluid. In the embodiment shown in FIG. 9, the temperature-control channel 115 contains two components. Therefore, an O-ring 14b is disposed in appropriate position to prevent from the leakage of the temperature-control fluid.

Figure 10:
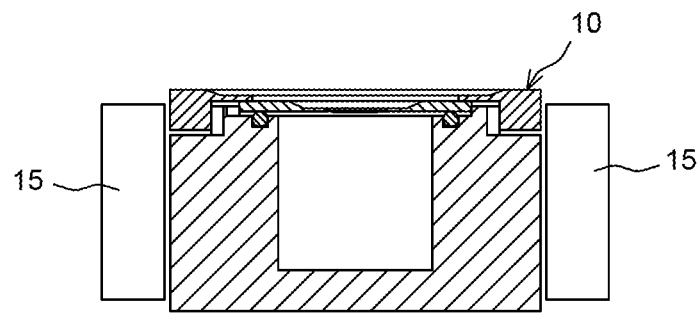
FIG. 10 is a diagram schematically showing an examination container according to an eighth embodiment of the present invention.

Refer to FIG. 10, the examination container 10 includes a temperature-control module 15 disposed outside the main body 11. The temperature-control module 15 can directly heat or cool the main body 11 or the whole examination container 10 to control the temperature of the sample or the examination environment. It is easily understood: the temperature-control module 15 can use a higher temperature, such as a temperature of more than 100 degrees Celsius or even a temperature as high as 300 degrees Celsius, to heat the main body 11 or the whole examination container 10 from exterior.

Figure 13:
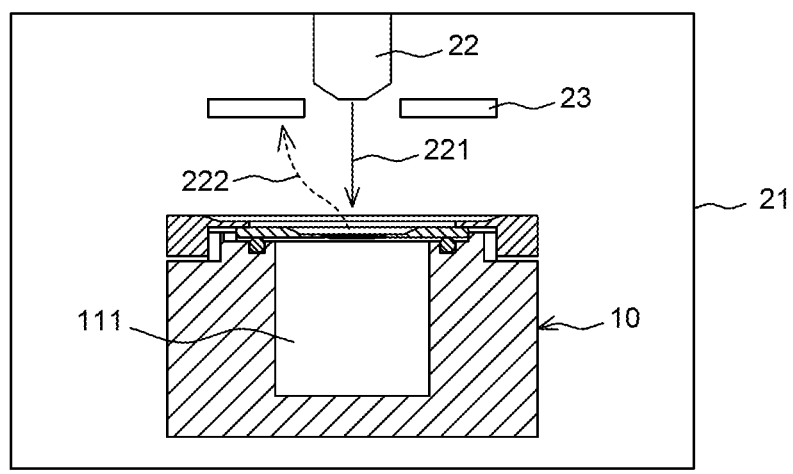
FIG. 13 is a diagram schematically showing an electron microscope according to one embodiment of the present invention.

Refer to FIG. 13, the electron microscope of the present invention includes an examination chamber 21, a charged particle beam generator 22, an examination container 10, and a detector 23. The examination chamber 21 defines a vacuum environment. The charged particle beam generator 22 interconnects with the examination chamber 21, generating a charged particle beam 221 inside the examination chamber 21. The examination container 10 is placed inside the examination chamber 21 and bombarded by the charged particle beam 221. The structure of the examination container 10 has been described in detail above and will not repeat herein. The detector 23 detects a response 222 to the bombarding of the charged particle beam 221 on the sample and converts the response 222 into an electronic signal. It is easily understood: the succeeding processing will convert the electronic signal into a microscope image or an X-ray spectrum. In one embodiment, the detector 23 is a charged particle detector, detecting the backward scattered charged particles from the sample. In one embodiment, the detector 23 is an energy dispersive X-ray detector, detecting the X-rays emitted by the sample bombarded by the charged particle beam 221. The other components of an electron microscope have been well known by the persons having ordinary knowledge in the field. Besides, these components is not the focus of the present invention. Therefore, they will not repeat herein.

In the abovementioned embodiments, the membrane assembly 12 is used to seal the examination container 10. However, the membrane assembly 12 of the present invention may also be used to seal the chamber containing the charged particle beam generator. In one embodiment, the chamber containing the charged particle beam generator has a locking mechanism similar to that of the main body of the examination container; a cover similar to that of the examination container is used to secure the membrane assembly 12 to the chamber and seal the chamber. Thereby, the sample can be examined in an open space.

In conclusion, the present invention provides a membrane assembly, an examination container and an electron microscope, wherein a flat support body is used to secure the membrane. Therefore, the operator can replace the broken or contaminated membrane assembly easily with less material consumed. Besides, the support body can be recycled to further reduce material consumption.

What is claimed is:

1. A membrane assembly comprising
a support body having a first surface and a second surface opposite to the first surface, wherein the support body is a flat structure and made of metallic material, metallic compound material or polymer material, and a first through-hole penetrates through the first surface and the second surface; and
a membrane disposed on the second surface of the support body and having a second through-hole, wherein the second through-hole corresponds to the first through-hole and allows a charged particle beam to pass.

2. The membrane assembly according to claim 1, wherein the support body has a thinned region, and the first through-hole is within the thinned region, and wherein a height of a sidewall of the first through-hole is reduced in the thinned region.

3. The membrane assembly according to claim 1, wherein a ratio of a height of a sidewall of the first through-hole to a width of the first through-hole is less than or equal to 0.7.

4. The membrane assembly according to claim 1, wherein the second surface of the support body has a second trough, and the membrane is disposed inside the second trough, and wherein a depth of the second trough is smaller than a thickness of the membrane.

5. The membrane assembly according to claim 4, wherein a shape of the second trough is a circle, a rectangle, or a rectangle with rounded corners.

6. The membrane assembly according to claim 1, wherein a sidewall of the second through-hole has stepped heights.

7. The membrane assembly according to claim 1, wherein the second through-hole has a shape in form of a circle, a rectangle or a slot.

8. An examination container, which is placed in an examination chamber of an electron microscope for examination of a sample inside the examination container, comprising:

a main body having an accommodating trough for holding the sample;
a membrane assembly covering an opening end of the accommodating trough and including:
 a support body having a first surface and a second surface opposite to the first surface, wherein the support body is a flat structure and made of metallic material, metallic compound material or polymer material, and a first through-hole penetrates through the first surface and the second surface; and
 a membrane disposed on the second surface of the support body and having a second through-hole, wherein the second through-hole corresponds to the first through-hole and allows a charged particle beam to pass; and
a cover detachably connected to the main body to secure the membrane assembly by directly pressing the support body of the membrane assembly.

9. The examination container according to claim 8, wherein the support body has a thinned region, and the first through-hole is within the thinned region, and wherein a height of a sidewall of the first through-hole is reduced in the thinned region.

10. The examination container according to claim 8, wherein a ratio of a height of a sidewall of the first through-hole to a width of the first through-hole is less than or equal to 0.7.

11. The examination container according to claim 8, wherein the second surface of the support body has a second trough, and the membrane is disposed inside the second trough, and wherein a depth of the second trough is smaller than a thickness of the membrane.

12. The examination container according to claim 8, wherein a sidewall of the second through-hole has stepped heights.

13. The examination container according to claim 8, wherein the cover is rotated with respect to the main body to engage with the main body.

14. The examination container according to claim 8, wherein the accommodating trough has a carrier stage disposed in a position corresponding to the second through-hole.

15. The examination container according to claim 14, wherein the accommodating trough has a fluid inlet and a fluid outlet, and wherein a distance between the membrane assembly and either of the fluid inlet and the fluid outlet is larger than a distance between the membrane assembly and the carrier stage.

16. The examination container according to claim 14, wherein the carrier stage is detachably disposed in the accommodating trough.

17. The examination container according to claim 14, wherein the carrier stage has a standing surface, and the sample props against the standing surface.

18. The examination container according to claim 14, wherein a distance between the carrier stage and the membrane assembly is adjustable.

19. The examination container according to claim 14 further comprising a sample pad detachably disposed on a top surface of the carrier stage.

20. The examination container according to claim 14, wherein the carrier stage has a temperature-control channel allowing a temperature-control fluid to flow thereinside.

21. The examination container according to claim 8 further comprising a temperature-control module disposed outside the main body.

22. An electron microscope comprising:

an examination chamber defining a vacuum environment;

a charged particle beam generator interconnecting with the examination chamber and generating a charged particle beam inside the examination chamber;

an examination container placed inside the examination chamber, bombarded by the charged particle beam, and including:
- a main body having an accommodating trough for holding a sample;
- a membrane assembly covering an opening end of the accommodating trough and including:
  - a support body having a first surface and a second surface opposite to the first surface, wherein the support body is a flat structure and made of metallic material, metallic compound material or polymer material, and a first through-hole penetrates through the first surface and the second surface; and
  - a membrane disposed on the second surface of the support body and having a second through-hole, wherein the second through-hole corresponds to the first through-hole and allows the charged particle beam to pass and bombard the sample; and
- a cover detachably connected to the main body to secure the membrane assembly by directly pressing the support body of the membrane assembly; and a detector detecting a response to bombarding of the charged particle beam on the sample and converting the response into an electronic signal.

* * * * *